United States Patent [19]

Mistretta et al.

[11] Patent Number: 5,204,627

[45] Date of Patent: Apr. 20, 1993

[54] ADAPTIVE NMR ANGIOGRAPHIC REPROJECTION METHOD

[75] Inventors: Charles A. Mistretta; Frank R. Korosec, both of Madison; David M. Weber, Middleton, all of Wis.

[73] Assignee: Wisconsin Alumni Research Foundation, Madison, Wis.

[21] Appl. No.: 669,143

[22] Filed: Mar. 14, 1991

[51] Int. Cl.$^5$ .............................................. G01R 33/20
[52] U.S. Cl. .................................... 324/309; 324/307
[58] Field of Search ..................... 128/653.3; 324/300, 324/307, 309, 318, 322, 306

[56] References Cited

U.S. PATENT DOCUMENTS

| | | | |
|---|---|---|---|
| Re. 32,701 | 6/1988 | Moran | 324/309 |
| 4,609,872 | 9/1986 | O'Donnell | 324/306 |
| 4,683,431 | 7/1987 | Pattany et al. | 324/306 |
| 5,025,788 | 6/1991 | Dumoulin | 128/653.3 |
| 5,031,624 | 7/1991 | Mistretta et al. | 128/653.3 |
| 5,034,694 | 7/1991 | Sattin et al. | 324/309 |
| 5,038,784 | 8/1991 | Dumoulin | 128/653.3 |
| 5,051,697 | 9/1991 | Pattany et al. | 324/306 |

OTHER PUBLICATIONS

"An Integrated 3-D Display of Intracranial Vasculature and the Brain Surface Created by Volume-Rendering NM Data" Book of Abstracts, vol. 2, *Society of Magnetic Resonance in Medicine*, Eighth Annual Meeting and Exhibition, Aug. 12-18, 1989, p. 869.
F. Korosec, D. Weber, C. Mistretta, "A Data Adaptive Reprojection Technique for MR Angiography," Dec. 1990.

*Primary Examiner*—Michael J. Tokar
*Attorney, Agent, or Firm*—Quarles & Brady

[57] ABSTRACT

A magnetic resonance angiogram is produced by projecting a 3D array of motion sensitized NMR data. A mask which locates the vessels in the 3D array is produced by thresholding the NMR data, and this mask is combined with the 3D NMR data set to exclude signals produced by surrounding stationary tissues. An integration projection technique is used to produce the angiogram from the masked data set.

9 Claims, 6 Drawing Sheets

ADAPTIVE NMR ANGIOGRAPHIC REPROJECTION METHOD

The invention was made with United States Government support awarded by the National Institute of Health (NIH), Grant #T32 CA09206-12. The United States Government has certain rights in this invention.

BACKGROUND OF THE INVENTION

The field of the invention is nuclear magnetic resonance angiography (MRA), and particularly, the reconstruction of an image from a three-dimensional array of NMR date acquired using a time-of-flight (TOF) or phase contrast method.

Magnetic resonance angiography has become a well accepted method for evaluating the vascular system and diagnosing vascular disease. This method involves the collection of NMR data which is sensitive to the movement of blood through the vascular system, but is relatively insensitive to the surrounding stationary tissues. There are two different methods used for providing such sensitivity: the time-of-flight method; and the phase contrast method. Time-of-flight methods such as those disclosed in U.S. Pat. Nos. 4,574,239; 4,532,473 and 4,516,582 rely on the time interval between the transverse excitation of spins and the acquisition of the resulting NMR signal to distinguish between moving and stationary spins. During the interval fresh spins move into the region from which the NMR signal is acquired and excited spins move out of the region. In contrast, the stationary spins remain fixed during the interval between RF excitation and data acquisition, with the result that the NMR signal produced by stationary spins is substantially different in magnitude from that produced by moving spins. When an image is reconstructed from such NMR signals, the image pixels which correspond to moving spins are much brighter with the result that the vascular system that transports rapidly moving blood is much brighter than the surrounding stationary, or slowly moving tissues.

The phase contrast methods for sensitizing the NMR signals to moving spins relies on the fact that the phase of the NMR signal produced by moving spins is different from the phase of NMR signals produced by stationary or slowly moving spins. As disclosed in U.S. Pat. Nos. 4,609,872; 4,683,431 and Re 32,701, phase contrast methods employ magnetic field gradients during the NMR pulse sequence which cause the phase of the resulting NMR signals to be modulated as a function of spin velocity. The phase of the NMR signals can, therefore, be used to control the contrast, or brightness, of the pixels in the reconstructed image. Since blood is moving relatively fast, the vascular system will appear brighter in the resulting image.

Regardless of the method used to acquire the motion sensitive NMR data, it is comprised of a 3-dimensional array of NMR data which indicates image brightness. This array may be acquired using a 3D NMR pulse sequence, or it may be acquired with 2D NMR pulse sequences applied to a set of adjacent slices. While images may be produced simply by selecting a set of these data points located in a cross section through the 3D array, such images have limited diagnostic value. This is because blood vessels usually do not lie in a single plane and such cross sectional images show only short pieces or cross sections of many vessels that happen to pass through the selected plane. Such images are useful when a specific location in a specific vessel is to be examined, but they are less useful as a means for examining the health of the vascular system and identifying regions that may be diseased.

For assessing overall blood vessel structure and health it is more useful to project the 3D array of NMR data into a single projection image to produce an angiogram-like picture of the vascular system. The most commonly used technique for doing this is to project a ray from each pixel in the projection image through the array of data points and select the data point which has the maximum value. The value selected for each ray is used to control the brightness of its corresponding pixel in the projection image. This method, referred to hereinafter as the "maximum pixel technique," is very easy to implement and it gives aesthetically pleasing images. However, because the maximum pixel technique utilizes only a small fraction of the vascular information embodied in the data set, much diagnostic information is lost. For example, only the brightest value encountered by the ray is used to represent information in the direction of the ray and if another equally bright value representing a second, overlapping vessel is present, this fact is lost in the process. The diagnostic importance of this information loss is illustrated in FIGS. 3A–3C, where FIG. 3A illustrates the image of two overlapping vessels produced by the maximum pixel technique, FIG. 3B represents one possible harmless interpretation of the image and FIG. 3C represents a second interpretation which indicates a vascular aneurysm. To resolve such ambiguities, it is common practice to reconstruct another projection image from a different angle. That is a time consuming and costly solution to the problem.

Another technique which is used to form a projection image and which retains more of the available information is what is referred to hereinafter as the "integration method". With this method the brightness of each projection image pixel is determined by the sum of all the data points along the projection ray. While this method does accurately show overlapping vessels and provide an indication of vessel narrowing in the projection direction, it yields an image in which the vessels are superimposed on an overwhelming background of stationary tissues. That is, the contrast between the background and vessels is substantially reduced and the evaluation of vessels, particularly small ones, becomes very difficult. Images produced by the integration method can be improved substantially simply by integrating only data points which exceed a user defined threshold value. However, if the threshold value is chosen too low, much of the background will be included and the image will be very noisy. On the other hand, if the threshold value is set too high, small vessels and the edges of larger vessels will be lost.

Yet another technique used to produce projection images uses a 3D region-growing method. The origins of the regions in the 3-D data set to be grown are operator determined. The grown regions are then blurred and thresholded to create a mask which includes voxels just outside the vessel edges, which may have been omitted in the region-growing process. This method gives a very smooth representation of the vasculature in which vessel edges are retained and vessel overlap can be deduced by use of visual cues which are included in the rendering process. The method, however, relies on connectivity. Therefore, vessels with signal dropout due to pathology or artifacts may be missed if the operator fails to place a seed before and after the region of signal loss. The 3D rendering is also computationally intense and is quite time consuming.

SUMMARY OF THE INVENTION

The present invention relates to a method and means for producing a magnetic resonance angiogram in which the information regarding vessel size, shape and overlap is accurately portrayed without introducing confusing information from background tissues. More specifically, the invention includes the acquisition of a 3-D NMR data set which is sensitive to spin velocity, producing a mask array by identifying the data points in the NMR data set which exceed a first threshold value and setting corresponding points in the mask array to a constant value, blurring the mask thereby enlarging the regions which have been set to the constant value, producing a masked NMR data set by multiplying the 3-D NMR data set by corresponding values in a binary version of the blurred mask array, filtering the masked NMR data set by setting to zero values therein which do not exceed a second threshold value, and producing a projection image in which the brightness of each pixel is determined by summing the values in the filtered NMR data set disposed on the pixel's projection ray.

A general object of the invention is to produce a magnetic resonance angiogram which maintains information regarding vessel overlap and vessel narrowing without increasing signal from stationary tissues. The mask array is produced by using a relatively high threshold value that serves to locate vessels. To insure that thin edges of vessels are shown, the mask is blurred to enlarge the mask and include regions surrounding each vessel. By applying this mask to the NMR data set all of the signals except those within the region of vessels are set to zero. After application of a second relatively low threshold, an integration can be performed along each projection ray to reconstruct an accurate image of the vessels without significant contribution from surrounding stationary tissues.

Another general object of the invention is to display small vessels in a magnetic resonance angiogram. To prevent the exclusion of small vessels from the image because they fail to meet the threshold value for the mask, the projection image produced from the filtered NMR data set according to the present invention is combined with a projection image produced by a maximum pixel technique. The two projection images are combined on a pixel-by-pixel basis to produce the final image. The weighting given to each pixel value in this combination varies as a function of their magnitude.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
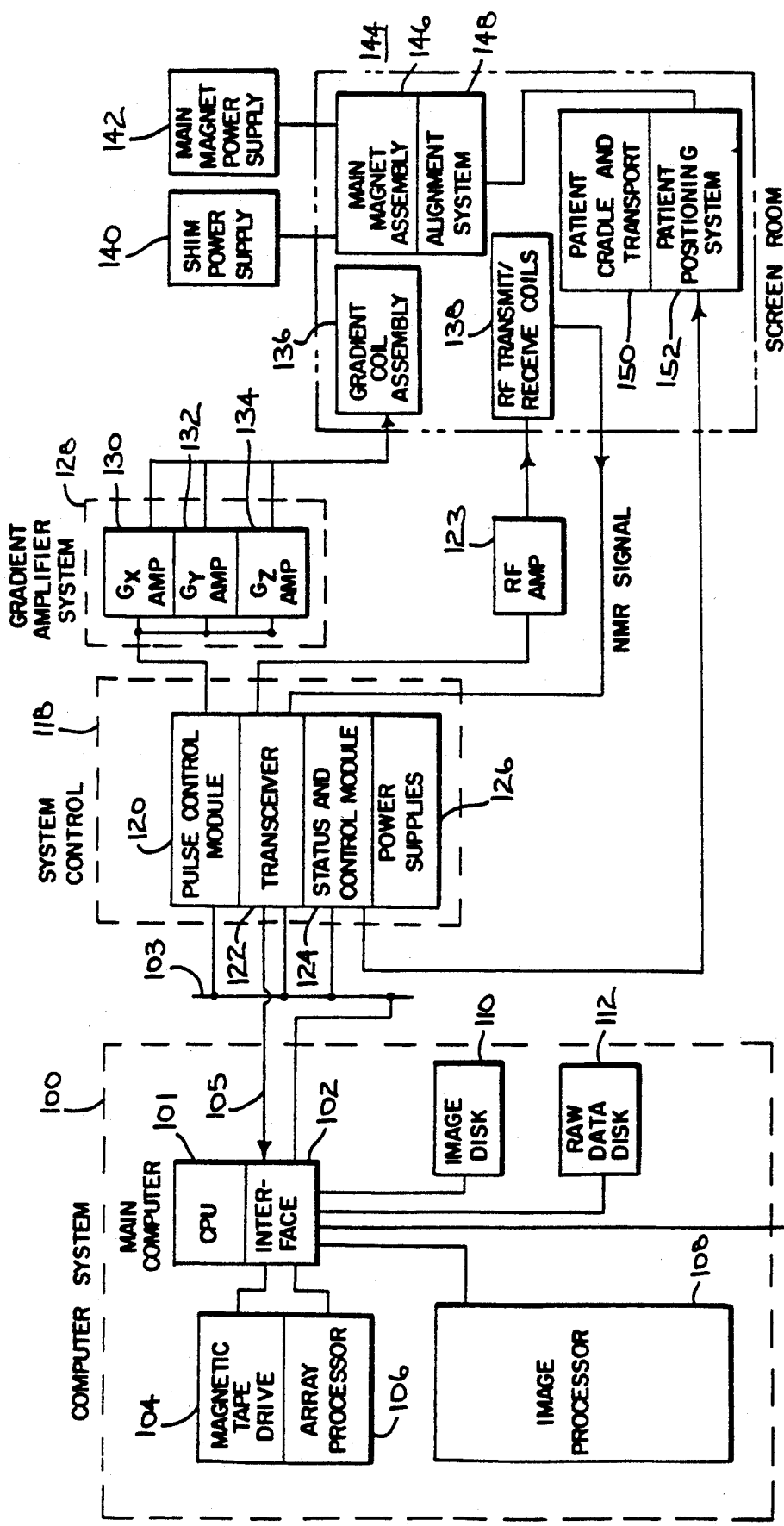
FIG. 1 is an electrical block diagram of an NMR system which employs the present invention.

Referring to FIG. 1 there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape and it enables the operator to select the desired projection view and to set the various threshold values that are employed in the present invention.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient control waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic fields which have gradients $G_x$, $G_y$ and $G_z$ that are directed along the respective orthogonal axes x, y and z. The amplitude and polarity of these gradients are determined by the amplitude and polarity of the control signals produced by the pulse control module 120. As will be described in more detail below, these control signals produce magnetic field gradients which follow precise waveforms that are necessary to practice the present invention.

The gradient magnetic fields are utilized in combination with radio frequency pulses generated by transceiver 122, RF amp 123 and RF coil 138 to selectively excite spins in the region of interest. Control signals provided by the pulse control module 120 are utilized by the transceiver subsystem 122 for RF carrier amplitude modulation and mode control. In the transmit mode, the transmitter provides a radio frequency signal to an RF power amplifier 123 which then energizes an RF coil 138A which is situated within main magnet assembly 146. The NMR signals radiated by the excited spin in the patient are sensed by a different RF coil 138B and the signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing magnetic field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
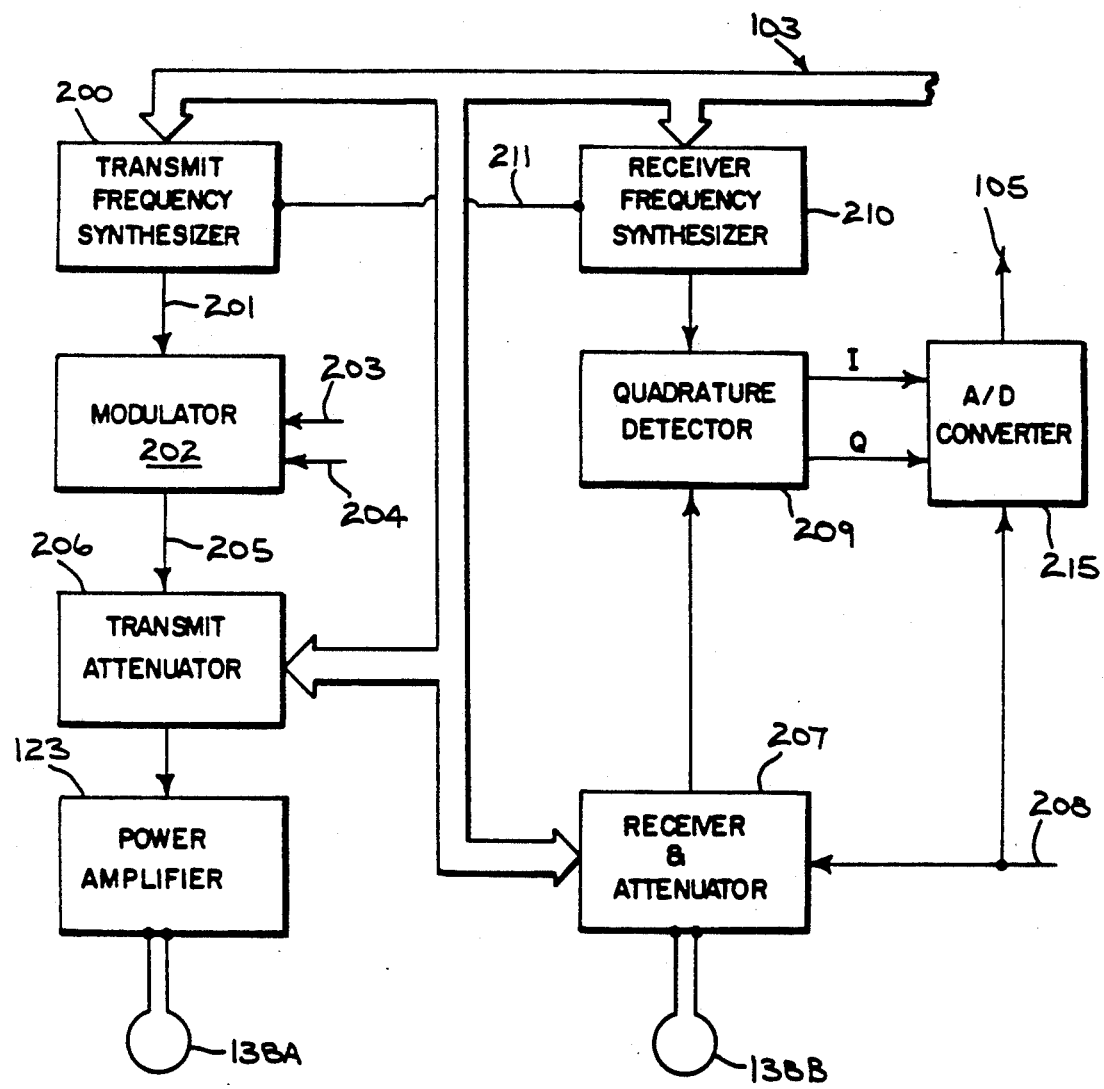
FIG. 2 is an electrical block diagram of a transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier signal is applied to a modulator 202 where it is amplitude modulated in response to control signals received through line 203 from the PCM 120. The resulting RF excitation signal is turned on and off in response to a control signal which is also received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmit coil 138A.

Referring still to FIGS. 1 and 2, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are received by a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 128 kHz to 1 MHz throughout the acquisition period. A set of 256 digital numbers are simultaneously acquired for each I and Q component of the NMR signal, and these digital numbers are conveyed to the main computer 101 through the serial link 105.

The three-dimensional array of velocity sensitive NMR data may be acquired with the NMR system of FIG. 1 using a number of known scans. For example, a data set comprised of sixty, 2D slices of time-of-flight NMR data may be acquired using a flow-compensation pulse sequence such as that described by P. J. Keller et al in an article entitled "MR Angiography with Two-dimensional Acquisition and Three-Dimensional Display" published in *Radiology* 1989; 173:527–532. With this method, sixty 1.5 mm contiguous axial slices are obtained using an RF excitation pulse having a 60° flip angle, a pulse repetition rate (TR) of 50 msecs, and an echo time (TE) of 14 msecs. Signal intensity from the background tissue is suppressed in this sequence because the stationary tissues experience multiple RF excitation pulses separated by short time intervals, and this saturation significantly reduces the NMR signals which such tissues produce. The blood flowing into the excited slice, however, experiences only a few RF excitation pulses and is unsaturated. The unsaturated spins of flowing blood produces significantly larger NMR signals that give rise to an increased pixel intensity and observed contrast in the reconstructed image. The acquired NMR signals in this case are processed, by performing a two-dimensional complex Fourier transformation on each slice. The transformed data is converted to motion sensitized image intensity data by calculating the magnitude of each complex data point in the 3D array.

Figure 4A:
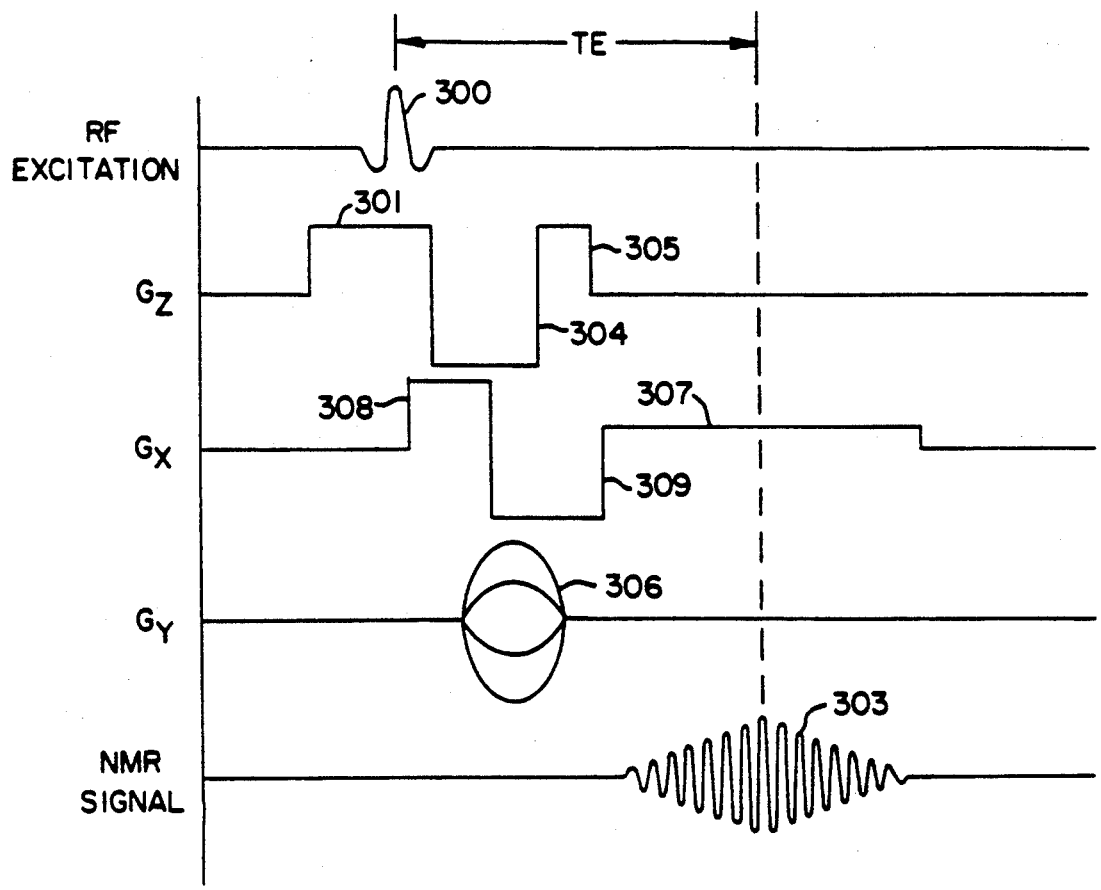
FIGS. 4A-4C are graphic representations of a 2D multi-slice NMR pulse sequence used to acquire a 3D NMR data set.

A three-dimensional array of velocity sensitive NMR data can also be acquired using a phase contrast method. A pulse sequence for acquiring a set of thirty-two 2D slices of such data is shown in FIG. 4A. This pulse sequence is a conventional first order, moment nulled, gradient echo sequence in which a selective RF excitation pulse 300 is applied to the subject in the presence of a $G_z$ slice select gradient pulse 301. It has a repetition time (TR) of 28 msec. and an echo time (TE) of 7 msec. The excitation pulse 300 has a flip angle $\alpha$, with a typical value of $\alpha$ being 30°. To compensate the NMR signal for the phase shifts caused by the slice select gradient pulse 301 and to desensitize the signal to velocity along the z axis, a negative $G_z$ gradient pulse 304 followed by a positive $G_z$ gradient pulse 305 are produced by the $G_z$ coils. For example, one solution is to use a pulse 304 of the same width, but opposite sign, as the pulse 301, and the pulse 305 is one half the width and the same height as the pulse 301. While the pulses 304 and 305 compensate for velocity along the z axis, more complex gradient waveforms are also well known to those skilled in the art for compensating acceleration and even higher orders of motion.

To position encode the NMR signal 303 a $G_y$ phase encoding gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 192 discrete phase encoding values to locate the position of the spins producing the NMR signal along the y axis. Position along the x-axis is determined by a $G_x$ gradient pulse 307. This pulse is produced as the NMR echo signal 303 is acquired and frequency encodes the NMR echo signal 303. Unlike the $G_y$ phase encoding gradient pulse 306, the $G_x$ readout gradient pulse 307 remains at a constant value during the entire scan. To produce the gradient echo 303 and to desensitize it to velocity along the x axis, gradient pulses 308 and 309 are produced prior to the pulse 307. Although there are a number of well known strategies to accomplish this; in one solution the pulse 309 is of the same width, but opposite polarity as the pulse 307, and pulse 308 is half the width and the same amplitude as pulse 309.

Figure 4B:
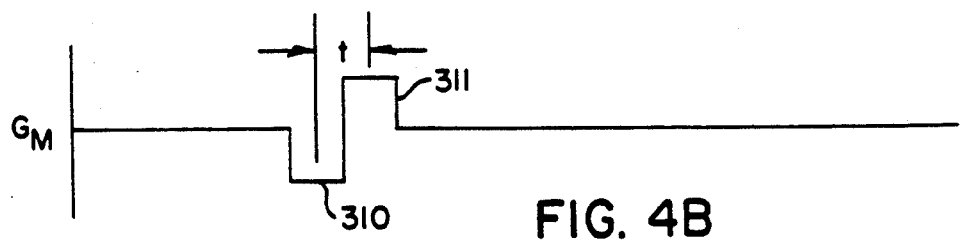

The pulse sequence of FIG. 4A is velocity sensitized by applying a bipolar gradient waveform $G_m$ shown in FIG. 4B. This gradient $G_m$ has a negative pulse 310 followed by a positive pulse 311, the area (A) defined by each pulse 310 and 311 is the same, and a time interval (t) separates them. The first moment produced by $G_m$ is the product of the pulse area (A) and separation (t) and it is produced by the same coils which produce the $G_x$, $G_y$ and $G_z$ gradient fields. By combining $G_x$, $G_y$ and $G_z$ gradient fields of the proper amplitude, the gradient moment $G_m$ can be oriented in any direction in space in order to sensitize for flow in that direction.

A scan is performed using the gradient moment $G_m$ of FIG. 4B in each pulse sequence. The NMR signal 303 is acquired by the system transceiver 122 and digitized into a row of 256 complex numbers which are stored in the memory of computer 101. For each of the 192 values of the $G_y$ phase encoding gradient and for each of the 32 slices, an NMR signal 303 is produced, acquired, digitized and stored. At the completion of the scan, therefore, 32 two-dimensional (256 × 192) arrays of complex numbers are stored in the computer 101. A two-dimensional, complex Fourier transformation is then performed on each array and the phase of each resulting data point is calculated by computing the arctangent of the real and imaginary components.

Figure 4C:
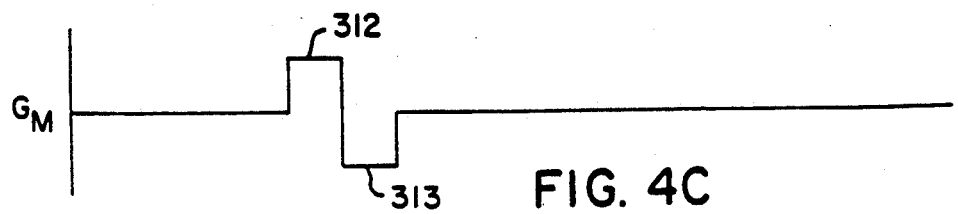

A similar 3D array of phase angle values is produced from a second scan which uses the velocity sensitizing gradient waveform $G_m$ of FIG. 4C. The same pulse sequence of FIG. 4A is used in this scan as well, but the gradient moment $G_m$ is reversed in polarity by producing gradient pulses 312 and 313 which are identical, but opposite in direction to the gradient pulses 310 and 311. The resulting 32 slices of 2D data are processed as described above to produce a second 3D array of phase values. The 3D array of velocity sensitized data employed by the present invention is then produced by subtracting each phase value in the second array from the corresponding phase value in the first array. Since system errors and stationary tissues will produce the same phase in both scans, system errors and signals produced by stationary tissues will cancel. On the otherhand, the phase produced by moving spins will have the opposite polarity and these values will add to provide the largest values where velocity is the highest.

Many other methods for producing a 3D array of motion sensitive NMR data are known in the art, and the present invention is equally applicable to produce an improved projection image from any such data set.

The 3D motion sensitized NMR data set is processed one slice at a time. The process now to be described in more detail operates on one 2D array of slice data at a time and the process is repeated for each slice in the 3D data set. The 3D data set thus modified is then used to produce a projection image. This process is carried out by the computer 101 in the NMR system of FIG. 1 in response to a stored program which will now be described.

Figure 5:
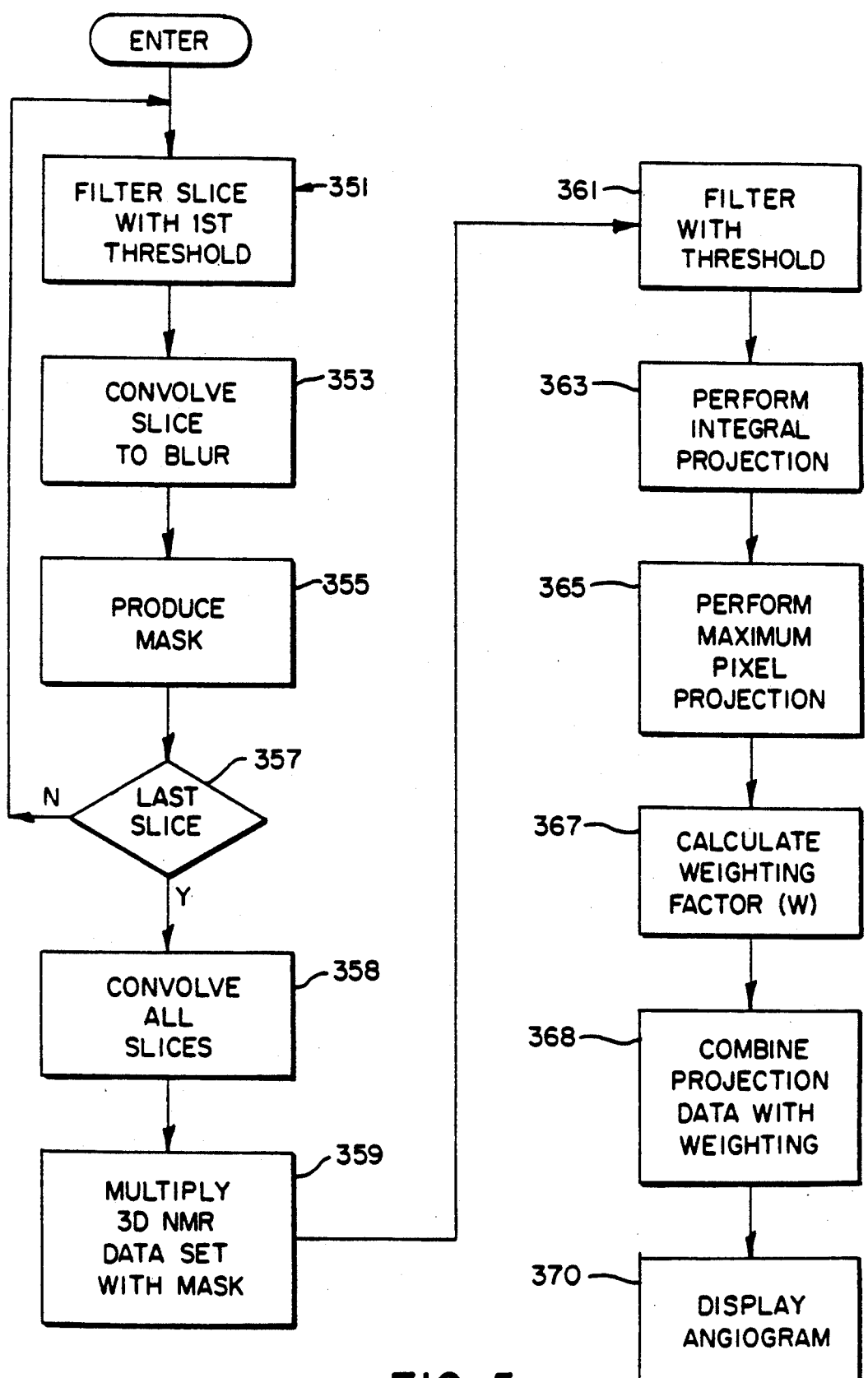
FIG. 5 is a flowchart of the program executed by the NMR system of FIG. 1 to practice the present invention.
Figure 6:
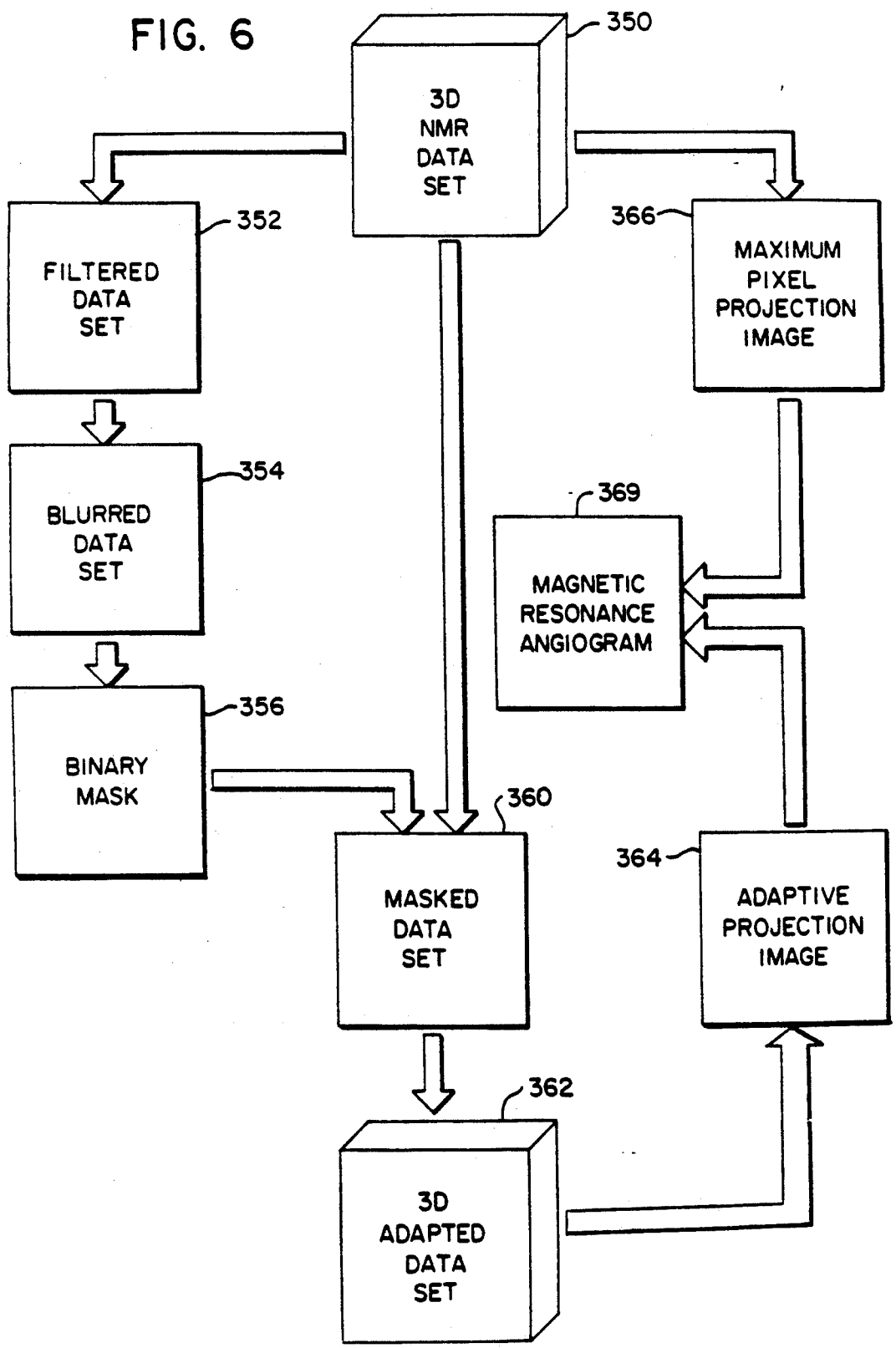
FIG. 6 is a schematic representation of the data structures produced by the program illustrated in FIG. 5.

Referring particularly to FIGS. 5 and 6 the three-dimensional array of motion sensitized NMR data is shown at 350 and it is used to perform a number of steps in the process. First, a copy of the 3D data set 350 is used to produce a mask. More specifically, a loop is entered in which a copy of each 2D slice in the 3D data set 350 is read out and the values therein filtered at process block 351 by setting to zero those values which do not exceed a first threshold value. The purpose of this first threshold is to identify the positions of the vessels of interest and eliminate all non-vascular signals. The value of all data points in the duplicate 2D slice which survive this first threshold are set to a constant value and stored as a filtered data set 352.

Because the first threshold results in narrower vessel regions than in the original 2D slice, the regions identified as vessels in the filtered data set 352 are enlarged by blurring. This is accomplished at process block 353 by convolving each value therein with a circular kernel having an amplitude which decreases linearly to a value of zero at a distance of seven pixels from the center of the convolution kernel. The data with enlarged regions is stored as a blurred data set 354.

The next step is to produce a binary mask 356. This is accomplished at process block 355 by setting to 1.0 all non zero values in the blurred data set 354.

The above process is repeated with each 2D slice in the 3D NMR data set 350. When the last 2D slice has been processed to produce a mask, as determined at decision block 357, the entire 3D binary mask is blurred in the slice direction. This blurring is accomplished as indicated at process block 358 by convolving the 3D binary mask with a kernel that extends over three slices and is uniformly weighted.

As indicated at process block 359 in FIG. 5, each 2D binary mask 356 is multiplied by its corresponding slice in the 3D NMR data set 350 to produce a masked data set 360 shown in FIG. 6. Each data point in the binary mask 356 is multiplied by the value of its corresponding data point in the 3D NMR data set 350. This sets to zero all data points outside the vessel regions identified in the binary mask 356. The resulting masked data set 360 contains NMR intensity data for all vessels which passed the first threshold level plus a small surrounding region of background information. As indicated at process block 361, this surrounding region is reduced in size through the application of a second threshold to each data point in the masked data set 360 to filter out more background information. It is possible to set this second threshold relatively low to preserve vessel width because the only background information in the masked data set 360 is limited to small regions around each vessel.

There is, therefore, a reduced probability of undesired background signals exceeding this threshold.

Figure 3A:
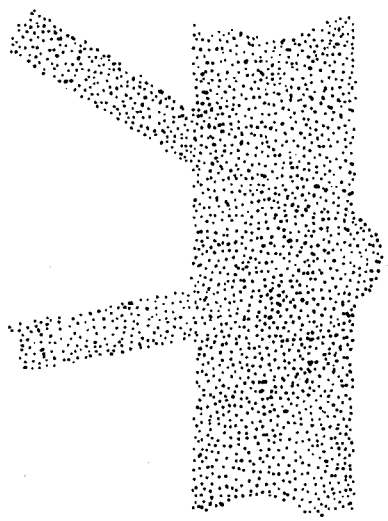
FIGS. 3A-3D are pictoral representations of vessels as seen in an angiogram and which illustrate the diagnostic advantages of the present invention.
Figure 3B:
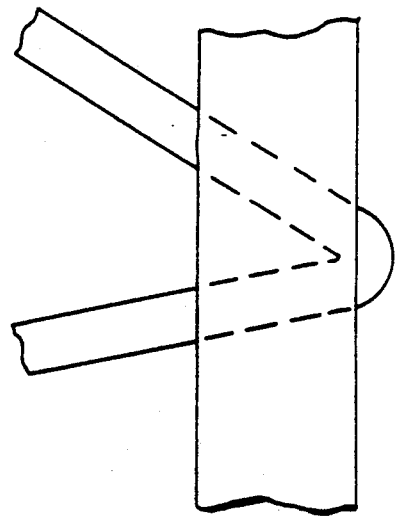
Figure 3C:
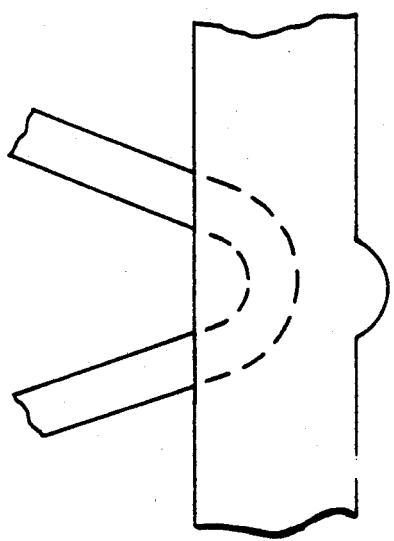
Figure 3D:
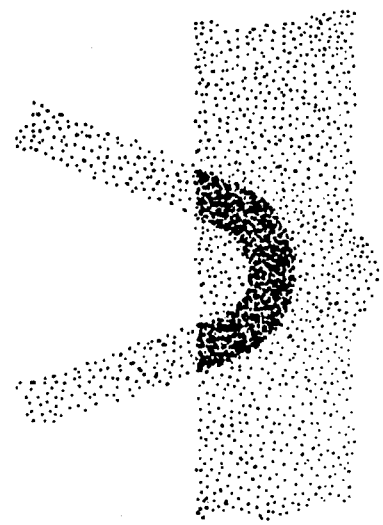

After application of the second threshold the 3D adapted data set 362 is complete and may now be employed to produce a 2D adaptive projection image 364. This is accomplished using a conventional integral projection technique as indicated at process block 363. A standard integral projection technique as described in detail above under the heading "Background of the Invention" is employed, and the resulting angiogram shows the overlapping vessels in such a manner as to preserve their structural information. This is illustrated in FIG. 3D, where the overlapping area of two vessels is indicated with higher intensity pixels in the image.

While the adaptive projection image 364 can be used directly to produce the final magnetic resonance angiogram 369, it has been discovered that improved results can be achieved by combining the adaptive projection image data with the data from a conventional maximum pixel projection image 366. This is particularly true when one or both threshold values are automatically preset and are not manually adjustable by the operator. This fully automated method is facilitated by producing the 2D maximum pixel projection image 366 at process block 365 using a conventional technique such as that described in an article by C. Anderson et al. entitled "Artifacts in Maximum Intensity Projection Display of MR Angiograms" published in *American Journal of Roentgenology* 1990; 154: 623-629. A weighting factor (W) is then calculated at process block 367 and the corresponding pixel elements in the two images 364 and 366 are combined at process block 368 to produce the MRA 369 which is displayed at process block 370. Prior to combining images 364 and 366, the values in the adaptive projection image 364 are modified so that the regions of vessel overlap do not occupy too much of the display's brightness dynamic range. This modification is a non-linear transformation of the pixel values using either a square root or logarithmic transformation function. In the combination process 368, the transformed image 364 is weighted by a factor which insures that the final MRA image 369 is primarily comprised of image 364 information in regions where image 364 was bright. This will include regions of vessel overlap. In other regions, where the adaptive reprojection image 364 was less intense, or where small vessels have been completely lost, the maximum pixel projection data becomes dominant in the image.

The specific weighting employed in the preferred embodiment is accomplished as follows. First, the value of each element in the adaptive projection image 364 is reduced by taking its square root or its logarithm. A square root transformation is used on time-of-flight NMR data and a logarithmic transformation is preferred on phase contrast NMR data. Then, the intensity range and average of the resulting image is adjusted so that it is essentially the same as the intensity range in the maximum pixel projection image 366. A weighting factor (W) is then calculated for each pixel in the adaptive projection image 364 as follows:

$$W = 30(S - S_{min})^2 / (S_{max} - S_{min})^2,$$

where
S = pixel value;
$S_{min}$ = smallest pixel value in image 364; and
$S_{max}$ = largest pixel value in image 364.

The adaptive projection image pixel value (S) is then combined with the corresponding maximum intensity pixel value (MIP) using the weighting factor (W) as follows:

$$MRA = (MIP + (W*S))/(W + 1).$$

While the first and second threshold values used in the above process are manually set by the operator, it is also possible to set the values automatically. The value of the first threshold is the most crucial, since a value too low will result in a background signal integration and a value too high will cause complete loss of small vessels. It has been discovered that the second threshold can be set to a value which is 75 percent of the value of the first threshold, and therefore, the problem reduces to a method for calculating the intensity level of the first threshold value.

One method for setting the first threshold value employs an intensity histogram technique. In this technique, a circular region in the image is defined which surrounds the vessels of interest. Two histograms are calculated from the image pixels located within this circular region. The first histogram indicates the number of pixels within the circular region which occur at each possible intensity level. This first histogram will include some pixels at high intensity levels, since the bright vessels of interest lie within the circular region and it will, therefore, reveal the characteristic intensity values of both vessels and background. The second histogram indicates the number of pixels at each intensity level within an annular region around the selected circular region. No vessels are included in this annular region and the histogram will contain low intensity values which are characteristic of background. The annular region is five pixels wide. The first threshold is then calculated from these histograms by determining the lowest intensity value which has an occurrence of less than two pixels in the first histogram and is greater than the maximum intensity value in the second histogram. This works well when the field of view (FOV) of the image is 20 centimeters, but it must be adjusted for other sized image FOV's. To accommodate this FOV dependency, the occurrence criterion (2 for 20 cm) is determined as follows:

$$\text{occurrence criterion} = 2(20 \text{ cm}/FOV)^2$$

This produces reasonable first threshold intensity values when applied to time-of-flight NMR data with an image FOV ranging from 16 cm to 20 cm. As indicated above, the second threshold is set to 75% of this computed value.

The MR angiograms produced by the present invention provide accurate projection images containing the greatest amount of vascular information. Vessel overlap and vessel narrowing in the projection direction are evident, and complete vessel information is represented all the way out to the vessel edges. This technique yields projection images very similar to the familiar DSA projection images in which signal intensity is proportional to vessel thickness, allowing for better recognition of pathology and unambiguous determination of vessel pathways. The additional information present in this single projection allows for a more complete evaluation of vascular disease through the use of fewer projections.

We claim:

1. A method for producing a magnetic resonance angiogram, the steps comprising:
   acquiring a 3D NMR data set comprised of a set of values which indicates by their magnitude the translational movement of spins and which indicates by their location in the 3D NMR data set the physical location of said spins;
   producing a binary mask having a set of binary values in which there is a binary value corresponding to each value in the 3D NMR data set and the binary values are determined by a) locating regions in the 3D NMR data set in which the magnitude of its values exceed a first threshold value, b) enlarging those regions and c) setting the binary values in the binary mask which correspond to said enlarged regions to one of their binary values;
   combining the 3D NMR data set with the binary mask to produce a 3D adapted data set in which values in the 3D NMR data set which correspond to binary values in the binary mask located outside the enlarged regions are removed from the 3D NMR data set; and
   producing a 2D magnetic resonance angiogram from the 3D adapted data set in which a brightness value of each pixel in the 2D magnetic resonance angiogram is determined by the sum of all the data points therein that are disposed along the pixel's projection ray.

2. The method as recited in claim 1 in which the regions are enlarged by convolving each data point located within said regions with a kernel.

3. The method as recited in claim 1 in which the binary mask is produced by:
   locating the regions in successive 2D slices of the 3D NMR data set in which the magnitude of the 3D NMR data set values exceed the first threshold value;
   enlarging those located regions in the plane of the 2D slice by convolving each 2D slice with a first kernel; and
   enlarging those located regions in the direction perpendicular to the planes of the 2D slices by convolving with a second kernel.

4. The method as recited in claim 3 in which the first kernel has a center pixel and surrounding pixels, and the surrounding pixels decrease in value as a function of distance from the center pixel.

5. The method as recited in claim 1 in which the brightness of each pixel in the 2D magnetic resonance angiogram is produced by combining the brightness value (S) as determined by the sum of all the data points in the 3D adapted data set that are disposed along the pixel's projection ray with a brightness value (MIP) as determined by the largest data point in the 3D NMR data set which is disposed along the pixel's projection ray.

6. The method as recited in claim 5 in which the brightness value (S) is multiplied by a weighting factor (W) before being combined with the other brightness value (MIP).

7. The method as recited in claim 5 in which the brightness values (S) and (MIP) are combined to produce the magnetic resonance angiogram pixel brightness value (MRA) as follows:

$$MRA = (MIP + (W^*S))/(W+1),$$

where W is a weighting factor.

8. The method as recited in claim 7 in which the weighting factor W is calculated as follows:

$$W = 30 \, (S - S_{min})^2/(S_{max} - S_{min})^2,$$

where $S_{min}$ is the smallest value in the 3D adapted data set and $S_{max}$ is the largest value in the 3D adapted data set.

9. The method as recited in claim 1 in which the first threshold value is determined by producing a first intensity histogram from data in the 3D NMR data set which includes both background data and vessel data, producing a second intensity histogram from the data in the 3D NMR data set which includes background data, and setting the first threshold value to the lowest intensity level which has less than a predetermined number of occurrences in the first intensity histogram and is greater than a maximum intensity level which occurs in the second intensity histogram.

* * * * *